United States Patent
Kulp

(10) Patent No.: US 7,425,689 B2
(45) Date of Patent: Sep. 16, 2008

(54) INLINE PHYSICAL SHAPE PROFILING FOR PREDICTIVE TEMPERATURE CORRECTION DURING BAKING OF WAFERS IN A SEMICONDUCTOR PHOTOLITHOGRAPHY PROCESS

(75) Inventor: John M. Kulp, Canyon Lake, TX (US)

(73) Assignee: Tokyo Electron Limited, Tokyo (JP)

( * ) Notice: Subject to any disclaimer, the term of this patent is extended or adjusted under 35 U.S.C. 154(b) by 210 days.

(21) Appl. No.: 11/535,900

(22) Filed: Sep. 27, 2006

(65) Prior Publication Data

US 2008/0083731 A1    Apr. 10, 2008

(51) Int. Cl.
H05B 3/68      (2006.01)
C23C 16/00     (2006.01)

(52) U.S. Cl. ................... 219/444.1; 118/725

(58) Field of Classification Search . 219/444.1–448.12, 219/390; 392/416–418; 118/724, 725; 432/253, 432/258, 259; 414/935–941
See application file for complete search history.

(56) References Cited

U.S. PATENT DOCUMENTS

| | | | |
|---|---|---|---|
| 5,941,083 A * | 8/1999 | Sada et al. | 62/99 |
| 6,072,162 A * | 6/2000 | Ito et al. | 219/444.1 |
| 6,191,394 B1 * | 2/2001 | Shirakawa et al. | 219/444.1 |
| 6,240,874 B1 | 6/2001 | Pike | |
| 6,402,509 B1 | 6/2002 | Ookura et al. | |
| 6,443,641 B2 | 9/2002 | Takamori et al. | |
| 6,478,578 B2 * | 11/2002 | Choi et al. | 432/253 |
| 6,499,777 B1 * | 12/2002 | Wang | 294/1.1 |
| 6,863,734 B2 * | 3/2005 | Takano | 118/725 |
| 6,992,270 B2 * | 1/2006 | Lee et al. | 219/444.1 |
| 7,094,994 B2 | 8/2006 | Oyama et al. | |

OTHER PUBLICATIONS

Smith et al., Modeling the impact of thermal history during post exposure bake on the lithographic performance of chemically amplified resists, Advances in Resist Technology and Processing XVIII, Francis M. Houlihan, Editor, Proceedings of SPIE, pp. 1013-1021, 2001, vol. 4345.

Shiobara et al., A novel post exposure bake temperature control to improve CD uniformity over product wafers, Fuji Film Interface 2005 Conference, San Diego, CA, Oct. 25, 2005, 24 pgs.

* cited by examiner

*Primary Examiner*—Sang Y Paik
(74) *Attorney, Agent, or Firm*—Wood, Herron & Evans, LLP

(57) ABSTRACT

The post exposure bake cycle in a chemically amplified resist process is more precisely controlled by measuring the distance from multiple locations on the bottom of each processed wafer to a reference plane surface while the wafer is supported on a cool plate. Subsequent to measuring the distance, the wafers are transferred to the hot plate that has a series of controllable heating elements. The set temperature for the heating elements is established in response to the distances measured while the wafer is on the cooling plate. The measurements are taken by utilizing proximity sensors located within the cooling plate.

26 Claims, 2 Drawing Sheets

INLINE PHYSICAL SHAPE PROFILING FOR PREDICTIVE TEMPERATURE CORRECTION DURING BAKING OF WAFERS IN A SEMICONDUCTOR PHOTOLITHOGRAPHY PROCESS

FIELD OF THE INVENTION

This invention relates to a method and apparatus to subject a semiconductor wafer to a post exposure bake (PEB).

BACKGROUND OF THE INVENTION

In the semiconductor photolithography process, the bake cycles are extremely important for uniformity and repeatability of the various process steps, with the most significant being the post exposure bake (PEB) cycle in a chemically amplified resist process. In this process, a photoresist is applied to the semiconductor surface. The photoresist is subjected to a mask exposure to apply a circuit pattern. Chemically amplified resists require both an exposure dose to generate a latent acid image, and a thermal dose to drive the deblocking reaction that changes the solubility of the resist. The post exposure bake must optimize the balance between relative rates of the diffusion and reaction processes.

Hot plates having uniformities within a range of a few tenths of a degree centigrade are currently available and are generally adequate for current process methods. However, there is an uncontrolled phenomena in the production implementation of this PEB process that is likely to cause severe issues as feature sizes continue to decrease. The phenomena, or problem, is that the hot plates are precisely calibrated using a flat bare silicon wafer with imbedded thermal sensors. But actual production wafers with deposited films on the surface of the silicon exhibit small amounts of warpage due to the stresses induced by the deposited films. This warpage can cause the normal gap between the wafer and the hot plate (referred to as the proximity gap), to vary across the wafer from a normal value of approximately 100 µm by as much as 100 µm deviation from the mean proximity gap.

This variability in the proximity gap changes the heat transfer characteristics in the area of the varying gap causing temperature non-uniformity on the wafer surface. This temperature difference can result in a change in critical dimension (CD) in that area of several nanometers, which can approach the entire CD variation budget for current leading edge devices, and will exceed the projected CD budget for smaller devices planned for production in the next few years.

In one current hot plate system, a combined cool plate and baking plate reside in one module. In this module, the silicon wafer is placed on the cool plate and then transferred internally in the module to the bake plate, and then, after baking, returned to the cool plate where it is subsequently removed to continue processing. The bake plate contains multiple zone heating elements for precise calibration of bake temperatures. For advanced work, proposals have been published to address the warpage issue by relying on a hope for consistency of warpage by device layer, and zone-based bake temperature adjustment for all wafers of a certain device layer.

SUMMARY OF THE INVENTION

The present invention is premised on the realization that in a post exposure bake utilizing both a cool plate and a hot plate, the topography of the bottom surface of a semiconductor wafer can be measured when the wafer is resting on the cool plate. The wafer is transferred from the cool plate to the hot plate and the topographical data is conveyed to a control system for the baking plate. Different heating elements in the hot plate are controlled to compensate for the differences in distances from the hot plate surface to the surface of the wafer, as predicted by wafer topography measurements made at the cool plate.

By imbedding proximity sensors into a cool plate where the wafer is positioned immediately prior to the baking step, one can measure the gap at a plurality of points between each individual wafer and the reference plane of the cool plate immediately prior to baking that individual wafer. From these measurements, a profile of the warpage of that wafer will be generated. From the profile data, individual temperature offsets to compensate for the proximity gap variation will be calculated from a reference look-up table, and the appropriate adjustments will be made to the individual heating element zones beneath the areas of proximity variation.

Since the ramp up of the temperature of a cold wafer is a dynamic event, small adjustments in control set points will stabilize during the ramp event. By this method, each wafer will see a customized heating event matching the physical shape of that individual wafer. The two primary advantages of this approach are individual wafer physical measurement for custom compensation, and high speed on the fly correction with no loss in production. This same method can be used in other similar wafer heating processes such as the post apply bake.

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1:
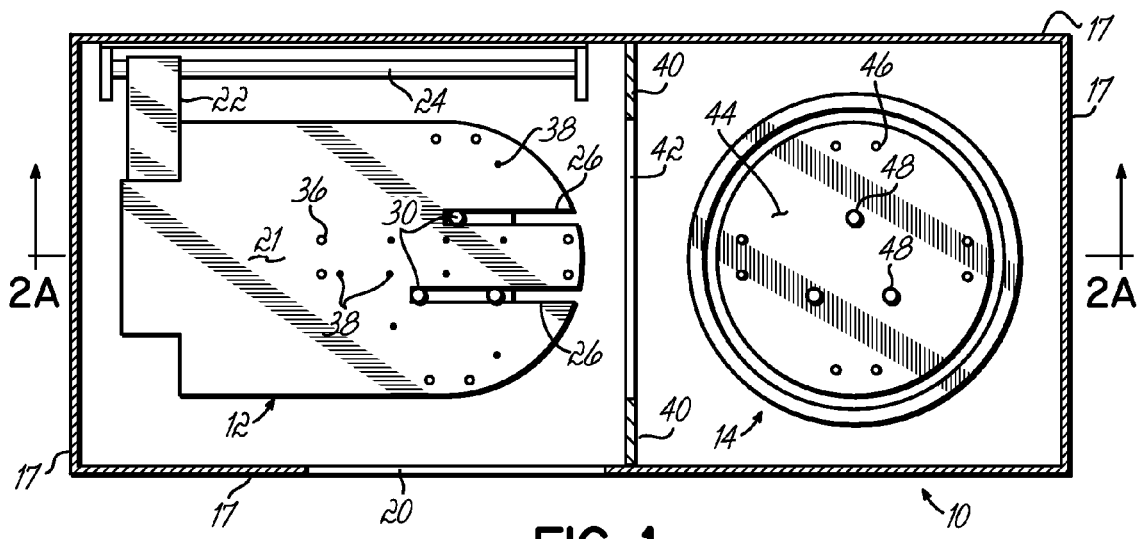
FIG. 1 is an overhead diagrammatic depiction of the apparatus of the present invention.

According to the present invention, a semi-conductor wafer is heated on a hot plate during the processing steps and generally subsequent to application of a chemically amplified resist.

The topography of the bottom surface of the semiconductor wafer is measured during processing immediately prior to locating the semiconductor wafer on a hot plate. A plurality of distances from a common plane to the bottom surface of the semiconductor wafer are measured. That information is then transferred to a control unit for the heating plate. The hot plate in turn is controlled to establish a plurality of heating zones corresponding to the measured locations and selectively heat areas of the semi-conductor wafer on the heating plate to compensate for differences in measured distances.

An apparatus or module 10 for practicing the present invention includes a cool plate 12 and a hot plate 14. The module 10 is surrounded by an exterior casing 16 which includes sidewalls 17 and top and bottom walls 18 and 19 respectively. An opening 20 through sidewall 17 permits access to the interior of module 10.

The cool plate 12 includes a support surface 21 supported by an arm 22 which moves along a guide support 24. The support surface 21 includes slots 26 and 28 which align with support posts 30. These support posts 30 extend from a common base 32 which is adapted to raise and lower the posts 30 relative to support surface 21 as shown by arrows 34 and 35. Support surface 21 includes a plurality of pins 36 adapted to support the semi-conductor wafer from its bottom surface so that the bottom surface of a wafer does not contact the support surface 21.

The support surface 21 of cool plate 12 includes a plurality of proximity sensors 38. The number and location of the proximity sensors will be determined by the configuration of the heating plate. Basically, a sufficient number of proximity sensors are utilized to provide sufficient data to control heating elements in hot plate 14. Accordingly, the more heating elements employed, the more sensors are required. If the hot plate has a series of concentric heating elements one would employ at least 3 sensors for each concentric ring located the same distance from a center point corresponding to one of the concentric heating elements as discussed below.

As shown in FIG. 1 the module 10 includes a central wall 40 between the cool plate 12 and the heating plate 14 an opening 42 allows a wafer to be transferred from the cool plate to the hot plate.

Figure 4:
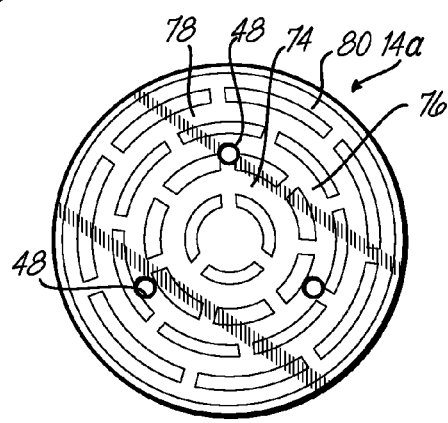
FIG. 4 is an overhead view of an alternate embodiment of the hotplate heating element.

The hot plate includes a surface 44 and a plurality of support pins 46 along with three holes 48 aligned with three posts 50 which are supported on a common base 52. Base 52 is designed to raise and lower the posts 50 as shown by arrows 53 and 55. As shown in FIG. 4, a series of controlled heating elements 56-60 are embedded in hot plate 14. These heating elements are selectively operated by a control unit 62.

Figure 5:
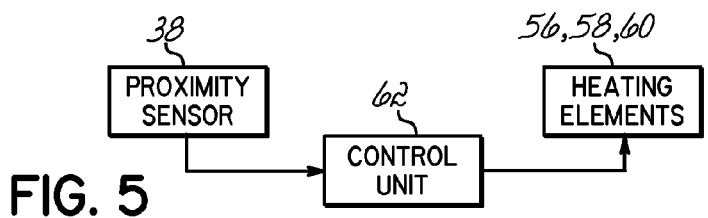
FIG. 5 is a diagrammatical depiction of the apparatus of the controls for the present invention.

As shown in FIG. 5 the proximity sensors 38 in cool plate 12 provide data to control unit 62 which in turn controls each of the heating elements 56-60 causing each element to reach a selected temperature. The control unit 62 receives the distance data determined by proximity sensors 38 and in turn establishes a set temperature for the individual heating element 56-60 in order to uniformly heat a wafer 62 during processing.

The temperature required for each heating element to uniformly heat the bottom surface of semi-conductor wafer can be determined emperically by testing the hot plate using sensors located at various distances from the surface of the hot plate and storing this data. Alternately, this can be determined utilizing the following algorithm $$\rho C_p L \frac{dT}{dt} = -\frac{k_{air}}{\delta}(T - T_{plate}) - h(T - T_{ambient})$$

where $\rho$ is the density of silicon, $C_p$ is the heat capacity of silicon, L is the thickness of the wafer, T is the temperature of the resist-coated wafer, $K_{air}$ is the thermal conductivity of air, $\delta$ is the thickness of the gap between the hot plate or cool plate and the wafer, and h is a coefficient for heat lost from the top surface of the wafer to the surroundings. Thus, the control 62 can either utilize stored emperical data or the algorithm in order to determine the set point for each heating element on the hot plate.

Figure 2A:
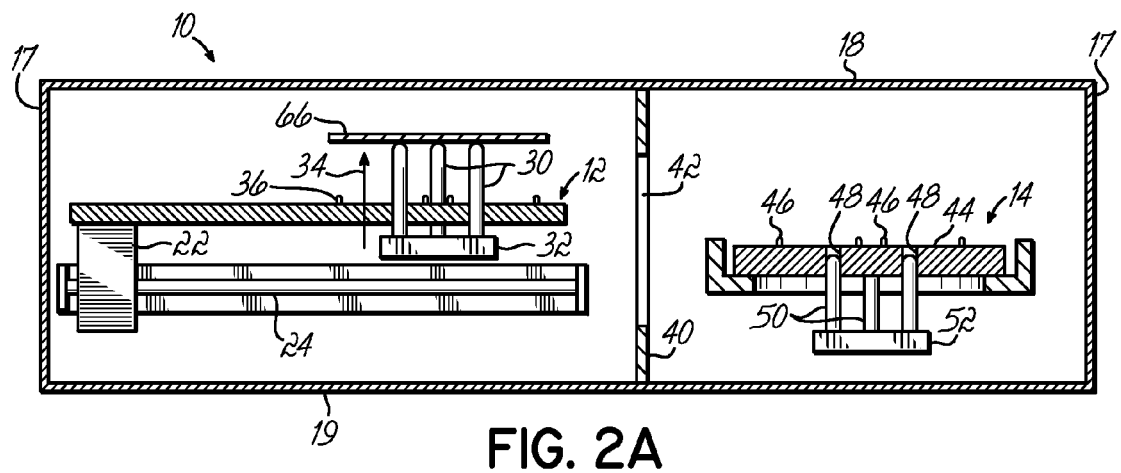
FIG. 2A is a cross sectional view taken at lines 2-2 of FIG. 1 showing a semi-conductor wafer being inserted in the apparatus of FIG. 1.
Figure 2B:
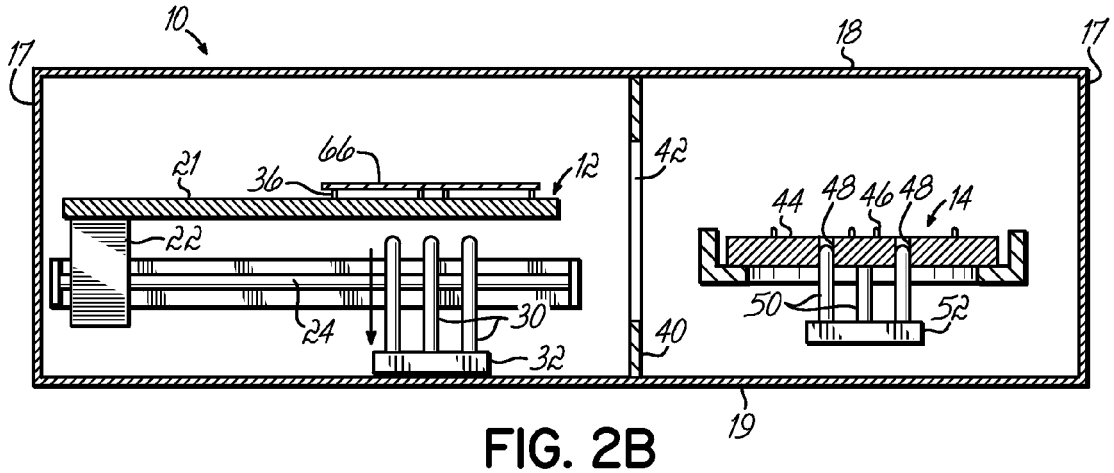
FIG. 2B is the same view as FIG. 2A with the wafer located on a cool plate in the apparatus shown in FIG. 1.

The following illustrates how one can measure the topography of the bottom of a wafer and uniformly heat the wafer without increasing processing time. As shown in FIGS. 2A-2D, a semiconductor wafer 66 is placed on posts 30 which are in the raised position as shown in FIG. 2A. The wafer 66 (preferably subsequent to a masking operation and exposure) is positioned on the posts 30 using for example, a robotic arm (not shown). The posts 30 are then lowered as indicated by arrow 35 in FIG. 2B and the wafer is supported on pins 30 above support surface 21. Proximity sensors 38 detect the distances between the proximity sensors which are all located on a common plane, and the bottom surface of the wafer 66.

Figure 2C:
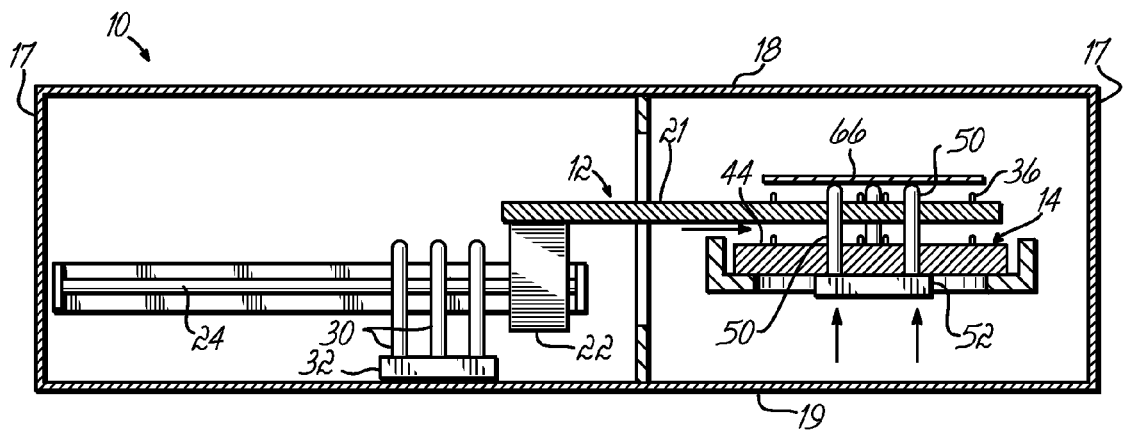
FIG. 2C is the same view as FIG. 2A showing the wafer transferring to the heating section of the device shown in FIG. 1.
Figure 2D:
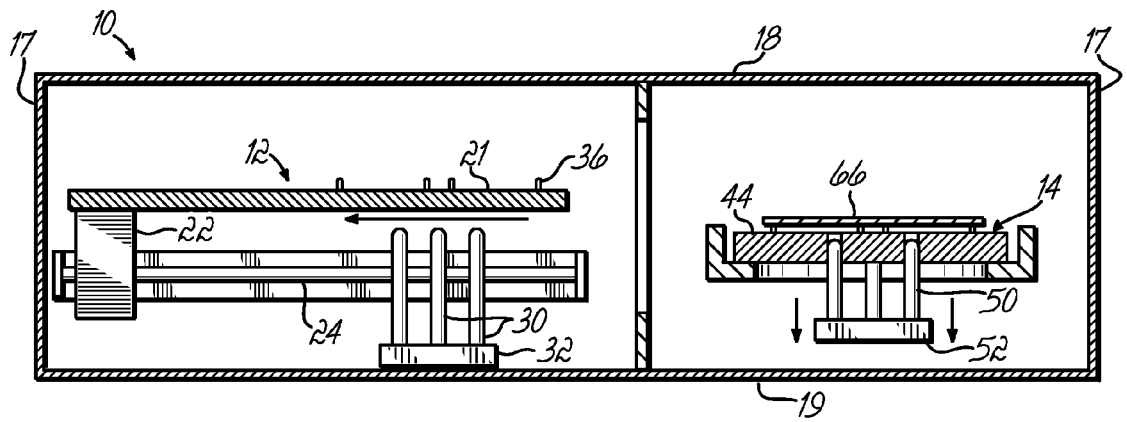
FIG. 2D is the same view as FIG. 2A showing the wafer resting on the hot plate of the apparatus shown in FIG. 1.
Figure 3:
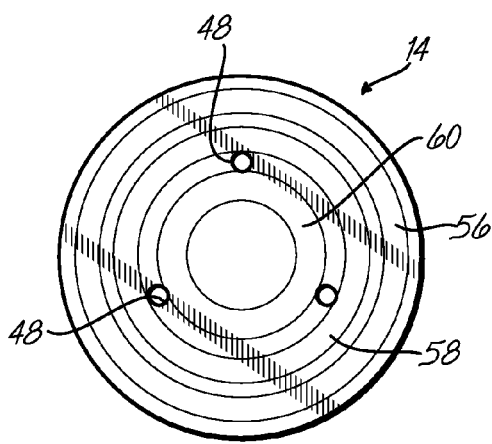
FIG. 3 is an overhead view of a hotplate heating element.

A variety of different proximity sensors can be used including infrared, acoustic, inductive, eddy current, and capacitive type proximity sensors and laser interferometers. Distance measurements are then transferred to the control unit 62. The arm 22 is driven by a motor (not shown) along guide 24 moving the cool plate 12 through opening 42 to a position above the hotplate 14. Posts 50 raise, extending through slots 26 and 28, and lift the wafer 66 off of the support surface 21. The arm 22 is then retracted back through opening 42 returning the cool plate to its original position. The posts 50 lower as shown in FIG. 2D positioning the wafer 66 on pins 46.

The control unit will make small adjustments in the control set points for heating elements 56, 58 and 60 prior to or during the transfer operation. Thus the heating elements 56-60 will recover at the new desired set temperature following the disruptive thermal event which occurs as the cool wafer is positioned on the hot plate 14. The heating step is continued for the desired period and the posts 50 are then raised as shown in FIG. 2C lifting the wafer 66 off the hot plate 12. The cool plate 12 is extended back through opening 42 below wafer 66 with the posts 50 within slots 26 and 28. The posts 50 are lowered and the wafer 66 rests on pins 36 of support surface 21. The cool plate 12 is then retracted retrieving the wafer 66 allowing it to cool and be removed from the module 10. The wafer 66 is removed and the process is repeated with a different wafer. This achieves a uniform heating of the semiconductor wafer during processing selectively heating the wafer for the post exposure bake. This is accomplished without requiring any additional processing time because the measurement of the bottom surface of the wafer is accomplished without any additional processing steps. This in turn provides greater tolerances for the device manufacturer without increasing processing time.

As shown in FIG. 4 an alternate embodiment of the heating plate 14 includes annular segmented heating elements. In this particular embodiment, four annular sets of heating elements 74, 76, 78, and 80 are employed with each one of these sets having 3-7 individual segmented heating elements, each of these heating elements can be selectively activated by the control unit 62 responsive to distances measured from the proximity sensors 38 located in the cool plate 12. To provide distance measurement needed to control these heating elements, the cool plate 12 would include at least one proximity sensor 38 for each of the heating elements. The particular arrangement of the heating elements can vary depending upon desired application. This procedure can be used in similar wafer heating processes such as the post apply bake.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. An apparatus to heat a semiconductor wafer comprising a cold plate having a support adapted to support said wafer and having measuring apparatus to measure distances from the surface of said wafer to said support surface at a plurality of points;
   a transfer mechanism to transfer said wafer from said support surface to a hotplate;
   said hot plate having a plurality of independently controllable heating elements;
   control mechanism to establish different set temperatures of said heating elements in response to said distances measured by said measuring apparatus.

2. The apparatus claimed in claim 1 wherein said heating elements comprise a series of concentric circles.

3. The apparatus claimed in claim 1 wherein heating element comprises a series of segmented heating elements.

4. The apparatus claimed in claim 1 wherein said measuring apparatus comprise a series of proximity sensors located in said cold plate.

5. The apparatus claimed in claim 4 wherein said proximity sensors comprise capacitive proximity sensors.

6. The apparatus claimed in claim 4 wherein said proximity sensors comprise infrared proximity sensors.

7. The apparatus claimed in claim 4 wherein said proximity sensors comprise acoustic proximity sensors.

8. The apparatus claimed in claim 4 wherein said proximity sensors comprise inductive proximity sensors.

9. The apparatus claimed in claim 4 wherein said proximity sensors comprise eddy current proximity sensors.

10. The apparatus claimed in claim 4 wherein said proximity sensors comprise laser interferometers.

11. The apparatus claimed in claim 1 wherein said cold plate comprises said transfer mechanism.

12. A method of heating a semiconductor wafer after a mask exposure comprising
    transferring said wafer to a cold plate and establishing a gap between a bottom surface of said wafer and a surface of said cold plate;
    measuring distances from a common plane to said bottom surface of said wafer with a plurality of sensors in said cold plate;
    transferring said wafer to a hot plate;
    applying localized heating to said bottom surface based on said distances.

13. The method claimed in claim 12 wherein said distance measurements are transferred to a control unit for said heating plate and said control unit establishes a set temperatures for each of a plurality of heating elements in response to said distances.

14. The method claimed in claim 13 wherein set temperatures are established in response to said measurement as applied to an algorithm.

15. The method claimed in claim 13 wherein said set temperatures are established by comparing said distances with empirical data stored in said control.

16. The method claimed in claim 12 wherein said wafer is transferred back to said cooling plate after said wafer is heated by said hot plate.

17. A combined cool plate and baking plate module comprising a cooling plate and a baking plate;
    transfer mechanism to transfer semiconductor wafers between said cooling plate and said baking plate;
    said cooling plate having a plurality of proximity sensors effective to measure distances from said proximity sensor to a bottom surface of a semiconductor wafer supported on said cooling plate;
    said baking plate having a plurality of controllable heating elements;
    said heating elements controlled by a controller responsive to distance measurements from said proximity sensors.

18. The apparatus claimed in claim 17 wherein said proximity sensors comprise capacitive proximity sensors.

19. The apparatus claimed in claim 17 wherein said proximity sensors comprise infrared proximity sensors.

20. The apparatus claimed in claim 17 wherein said proximity sensors comprise acoustic proximity sensors.

21. The apparatus claimed in claim 17 wherein said proximity sensors comprise inductive proximity sensors.

22. The apparatus claimed in claim 17 wherein said proximity sensors comprise eddy current proximity sensors.

23. The apparatus claimed in claim 17 wherein said proximity sensors comprise laser interferometers.

24. The method claimed in claim 17 wherein said controller comprises a processor adapted to apply a algorithm to said distance measurements to control said heating elements.

25. The apparatus claimed in claim 17 wherein said controller includes a memory to control said heating zones responsive to stored empirical data.

26. A method of subjecting a semiconductor wafer to a post apply bake comprising
    transferring said wafer to a cold plate and establishing a gap between a bottom surface of said wafer and a surface of said cold plate;
    measuring distances from a common plane to said bottom surface of said wafer with a plurality of sensors in said cold plate;
    transferring said wafer to a hot plate;
    applying localized heating to said bottom surface based on said distances.

* * * * *

UNITED STATES PATENT AND TRADEMARK OFFICE
CERTIFICATE OF CORRECTION

PATENT NO. : 7,425,689 B2
APPLICATION NO. : 11/535900
DATED : September 16, 2008
INVENTOR(S) : John M. Kulp It is certified that error appears in the above-identified patent and that said Letters Patent is hereby corrected as shown below:

Col. 1, line 59, "for all waters" should read --for all wafers--.
Col. 2, line 38, "taken at lines 2-2" should read --taken at line 2-2--.
Col. 3, lines 31-32, "14 an opening" should read --14 and an opening--.
Col. 4, line 10, "using for example, a robotic arm" should read --using, for example, a robotic arm--.
Col. 6, line 1, "a set temperatures for" should read --a set temperature for--.
Col. 6, lines 4-5, "claim 13 wherein set temperatures" should read --claim 13 wherein said set temperatures--.

Signed and Sealed this

Twenty-fourth Day of February, 2009

JOHN DOLL
*Acting Director of the United States Patent and Trademark Office*